(12) United States Patent
Lo et al.

(10) Patent No.: US 10,344,397 B2
(45) Date of Patent: Jul. 9, 2019

(54) III-NITRIDE EPITAXIAL STRUCTURE AND METHOD FOR MANUFACTURING THE SAME

(71) Applicant: NATIONAL SUN YAT-SEN UNIVERSITY, Kaohsiung (TW)

(72) Inventors: I-kai Lo, Kaohsiung (TW); Chen-Chi Yang, Kaohsiung (TW); Ming-Chi Chou, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 261 days.

(21) Appl. No.: 15/466,349

(22) Filed: Mar. 22, 2017

(65) Prior Publication Data

US 2018/0119307 A1  May 3, 2018

(30) Foreign Application Priority Data

Oct. 28, 2016  (TW) .............................. 105135122 A (51) Int. Cl.

| | | |
|---|---|---|
| C30B 25/10 | (2006.01) | |
| C30B 29/40 | (2006.01) | |
| H01L 33/32 | (2010.01) | |
| H01L 33/16 | (2010.01) | |
| H01L 33/00 | (2010.01) | |

(52) U.S. Cl.
CPC .......... *C30B 25/105* (2013.01); *C30B 29/403* (2013.01); *H01L 33/007* (2013.01); *H01L 33/16* (2013.01); *H01L 33/32* (2013.01)

(58) Field of Classification Search
CPC ..... C30B 25/105; C30B 29/403; H01L 33/32; H01L 33/16; H01L 33/007
See application file for complete search history.

(56) References Cited

U.S. PATENT DOCUMENTS

| 8,242,523 B2 | 8/2012 | Gwo et al. |
|---|---|---|
| 8,916,458 B2 | 12/2014 | Lo et al. |

FOREIGN PATENT DOCUMENTS

| CN | 103531605 A | 1/2014 |
|---|---|---|
| TW | 201626551 A | 7/2016 |
| TW | I540752 B | 7/2016 |

*Primary Examiner* — Michael C Miggins
(74) *Attorney, Agent, or Firm* — Muncy, Geissler, Olds & Lowe, P.C.

(57) ABSTRACT

An III-nitride epitaxial structure and a method for manufacturing the same are disclosed. The III-nitride epitaxial structure includes a gallium nitride layer, an indium gallium nitride layer, and an indium nitride layer. The gallium nitride layer includes an M-plane gallium nitride surrounding a c-plane gallium nitride thereof. The indium gallium nitride layer is arranged on the gallium nitride layer. The indium gallium nitride layer includes an M-plane indium gallium nitride surrounding a c-plane indium gallium nitride thereof. The indium nitride layer is arranged on the indium gallium nitride layer. The indium nitride layer includes an M-plane indium nitride surrounding a c-plane indium nitride thereof. The c-plane gallium nitride, the c-plane indium gallium nitride, and the c-plane indium nitride are stacked each other to form a neck portion that is connected to a thin c-plane indium nitride disk which is spaced from the M-plane indium nitride by a gap.

10 Claims, 6 Drawing Sheets
(4 of 6 Drawing Sheet(s) Filed in Color)

III-NITRIDE EPITAXIAL STRUCTURE AND METHOD FOR MANUFACTURING THE SAME

CROSS REFERENCE TO RELATED APPLICATIONS

The application claims the benefit of Taiwan application serial No. 105135122, filed on Oct. 28, 2016, and the subject matter of which is incorporated herein by reference.

BACKGROUND OF THE INVENTION

1. Field of the Invention

The present disclosure generally relates to III-nitride and, more particularly, to III-nitride having indium nitride microdisks.

2. Description of the Related Art

For the conventional light-emitting diodes (LEDs), there are two approaches to generate white light with GaN-based material. In the first approach, the blue light generated by indium gallium nitride can be mixed with yellow-light (Ce-doped yttrium aluminum garnet, YAG, which is its complementary color) phosphor to generate white light. In the second approach, the $In_xGa_{1-x}N$/GaN red-light, green-light and blue-light LEDs can respectively emit monochromatic lights to be mixed with each other to generate white light.

The first approach is currently the mainstream of the light-emitting technology. However, it has some disadvantages. First, the first approach falls within the scope of the patent owned by S. Nakamura. Secondly, it is difficult to acquire the rare-earth elements such as yellow-light (Eu-doped), red-light (Er-doped) and green-light (Tm-doped) phosphors. Third, the yellow light is generated from the blue light generated by the indium gallium nitride. Namely, the energy of the blue light is partially absorbed by the phosphor (Ce-doped YAG) and converted into the yellow light. The conversion process causes the loss of the energy and reduces the light-emitting efficiency. The loss of the energy occurs in the form of thermal radiation, which makes the device fragile and shortens the service life of the device.

The easiest way to overcome the above problem would be to adopt the second approach which does not require the phosphor. However, the semiconductor physics suggests that the lattice mismatch between indium nitride and gallium nitride along the "a" axis is as high as 10.9%. Thus, it is difficult to grow high indium content of $In_xGa_{1-x}N$/GaN quantum wells on the GaN microdisks. In addition, the GaN microdisk usually has a thickness of 2 μm which is larger than required. Therefore, it would be needed to cut the bottom part of the microdisk, leading to a complex production process. Furthermore, most of the researches regarding the 3D InN are directed to nanowires or nanopillars. The diameter of the nanowire or nanopillar is usually 70 nm only and includes an acute tail end (non-planar form). Thus, it is not suitable for growing the $In_xGa_{1-x}N$/GaN quantum wells. Although the acute tail end can be shaped into a planar form, the size is still too small to be used in the modern production process.

Thus, it is necessary to improve the conventional epitaxial structure.

SUMMARY OF THE INVENTION

It is therefore the objective of this disclosure to provide an III-nitride epitaxial structure which is able to form thin InN microdisks. The thin InN microdisks can be used to grow high indium content of $In_xGa_{1-x}N$/GaN quantum wells, thus providing a higher lattice match rate.

It is another objective of this disclosure to provide a method for manufacturing the III-nitride epitaxial structure. The method can form thin InN microdisks to grow high indium content of $In_xGa_{1-x}N$/GaN quantum wells, thus providing a higher lattice match rate.

In an embodiment, an III-nitride epitaxial structure is disclosed. The III-nitride epitaxial structure may include a gallium nitride layer, an indium gallium nitride layer, and an indium nitride layer. The gallium nitride layer includes an M-plane gallium nitride and a c-plane gallium nitride, in which the M-plane gallium nitride surrounds the c-plane gallium nitride. The indium gallium nitride layer is arranged on the gallium nitride layer. The indium gallium nitride layer includes an M-plane indium gallium nitride and a c-plane indium gallium nitride, in which the M-plane indium gallium nitride surrounds the c-plane indium gallium nitride. The indium nitride layer is arranged on the indium gallium nitride layer. The indium nitride layer includes an M-plane indium nitride and a c-plane indium nitride, in which the M-plane indium nitride surrounds the c-plane indium nitride. The c-plane gallium nitride, the c-plane indium gallium nitride, and the c-plane indium nitride are stacked each other to form a neck portion. The neck portion is connected to a thin c-plane indium nitride disk, and the thin c-plane indium nitride disk is spaced from the M-plane indium nitride by a gap.

In another embodiment, a method for manufacturing an III-nitride epitaxial structure is disclosed. The method may include setting a temperature of a substrate as 800° C. in order for gallium atoms to be placed on the substrate for a first growth time (such as 5 minutes), maintaining a plasma power as 300 W and a flux ratio of nitride to gallium as 39.9 to 55.9 under a growth temperature of 800° C. for a second growth time (such as 25 minutes) and then under the growth temperature of 850° C. for a third growth time (such as 30 minutes); reducing the temperature of the substrate to 650° C. while maintaining a flux ratio of indium to gallium as 1.26 for a fourth growth time (such as 30 minutes); and increasing the plasma power to 450 W and adjusting a flux ratio of nitride to indium as 39.3 while maintaining the temperature of the substrate as 470° C. for a fifth growth time (such as 60 minutes).

In a form shown, the thin c-plane indium nitride disk may have a growth direction. A side cross section of the thin c-plane indium indium nitride disk may have an inclined edge facing the M-plane indium nitride. An included angle between the inclined edge and the growth direction is between 72-73 degrees. An interface between the c-plane indium gallium nitride and the c-plane indium nitride is in a non-planar form.

With the III-nitride epitaxial structure and the method for manufacturing the same as presented above, thin indium nitride microdisks can be formed on the lithium aluminate substrate under a low temperature of 470° C. using plasma-assisted molecular beam epitaxy technology. When the β-dangling bonds of the most-outside indium atoms capture the nitride atoms, the β-dangling bonds of the N atoms also capture the indium atoms and the lateral growth occurs. From the analyses of high-resolution transmission electron microscopy, the lateral over-grown width is extended to three unit cells at c-axis direction for a unit step-layer, resulting in an oblique surface with 73° off c-axis. Therefore, the application can effectively grow the thin InN microdisks for growth of the $In_xGa_{1-x}N$/GaN quantum wells, and it is not required to cut the thin InN microdisks. Accordingly, the thin InN microdisks can be used in the GaN-based while light LED, effectively reducing the lattice mismatch in the a-axis. The produced LEDs can have a higher light-emitting efficiency, a simplified production process and a reduced energy consumption and cost. This is advantageous in producing the light-emitting devices with a higher illumination quality for daily life, increasing the industrial value and achieving a win-win situation among the users, manufactures and governments.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present disclosure will become more fully understood from the detailed description given hereinafter and the accompanying drawings which are given by way of illustration only, and thus are not limitative of the present disclosure, and wherein.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

The term "wurtzite" mentioned hereinafter refers to a hexagonal mineral structure wherein the "c" axis denotes the $[000\bar{1}]$ direction in the four dimensional coordinate system, as it can be readily appreciated by one having ordinary skill in the art.

The term "c plane" mentioned hereinafter refers to a hexagonal plane on the top of a hexagonal prism, as it can be readily appreciated by one having ordinary skill in the art.

The term "M plane" mentioned hereinafter refers to a rectangular plane on a lateral side of a hexagonal prism, as it can be readily appreciated by one having ordinary skill in the art.

Figure 1:
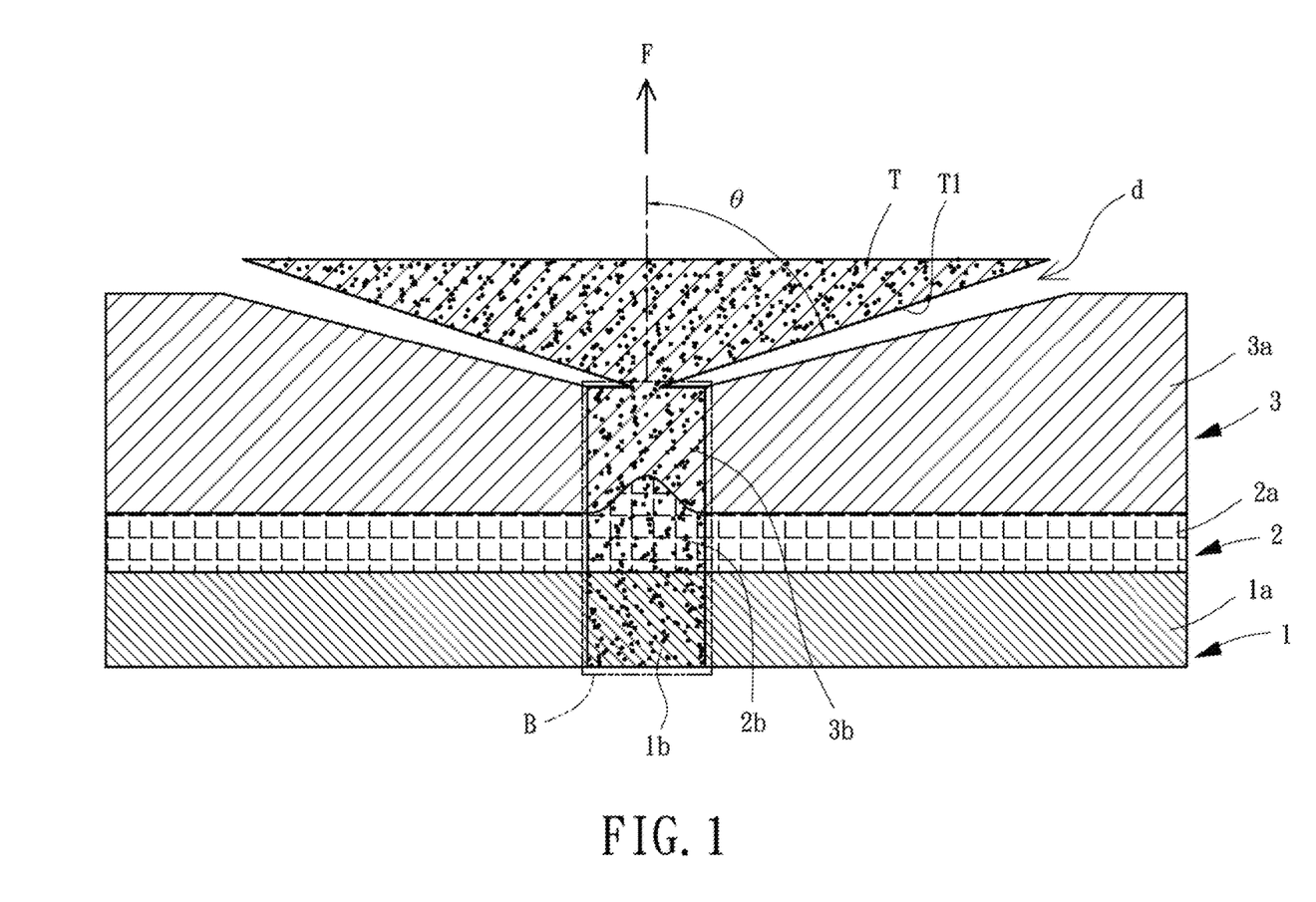
FIG. 1 is a cross sectional view of an III-nitride epitaxial structure according to an embodiment of the disclosure.

FIG. 1 is a cross sectional view of an III-nitride epitaxial structure according to an embodiment of the disclosure. The III-nitride epitaxial structure may include a gallium nitride (GaN) layer 1, an indium gallium nitride layer (InGaN) 2 and an indium nitride (InN) layer 3. The InGaN layer 2 may be arranged on the GaN layer 1, and the InN layer 3 may be arranged on the InGaN layer 2.

In the embodiment, the GaN layer 1 may be grown on a substrate, such as lithium aluminate (LAO). The GaN layer 1 may include an M-plane GaN 1a surrounding a c-plane GaN 1b. The InGaN layer 2 may include an M-plane InGaN 2a surrounding a c-plane InGaN 2b. The InN layer 3 may include an M-plane InN 3a surrounding a c-plane InN 3b. The c-plane GaN 1b, the c-plane InGaN 2b and the c-plane InN 3b can be stacked each other to form a neck portion B. The neck portion B is connected to a thin c-plane InN disk T (with a thickness of 200 nm), which is spaced from the M-plane InN 3a by a gap d. The thin c-plane InN disk T has a growth direction F. The side cross section of the c-plane InN disk T includes an inclined edge T1 facing the M-plane InN 3a. An included angle between the inclined edge T1 and the growth direction F may be 72-73 degrees. The interface between the c-plane InGaN 2b and the c-plane InN 3b may be non-planar (as shown in FIG. 1). A grown sample of the III-nitride epitaxial structure is elaborated below, but this is not used to limit the disclosure.

For example, when it is desired to grow the III-nitride epitaxial structure, the low-temperature plasma-assisted molecular beam epitaxy (PA-MBE) system such as Veeco Applied-GEN 930 may be used as an epitaxial equipment. The epitaxial equipment includes standard effusion cells for In- and Ga-evaporation and a radio frequency plasma cell with 300 W for N2-plasma source. As such, the sample can be grown on high-quality 1×1 cm² LAO (100) substrate, but this is not used to limit the disclosure. The LAO substrate may be cut from a crystal ingot fabricated by the conventional Czochralski pulling technique. Before the epitaxial growth of the sample, a cleaning process can be performed in advance. In the cleaning process, the LAO substrate may be cleaned with acetone for 5 minutes, with isopropanol for 5 another minutes, with the de-ionized water for a further 5 minutes, and then is immediately dried with nitrogen gas. Afterwards, a thermal treatment is introduced to the substrate in the epitaxial equipment. In the thermal treatment, the substrate is out-gassed at 850° C. for 10 minutes. The temperature can be set by a thermal couple equipped at the backside of the substrate. First, the gallium atoms can be placed on the LAO substrate for 5 minutes at 800° C. Then, a two-step method (i.e. two different N/Ga flux ratio from 39.9 to 55.9, for 25 and 30 minutes, at 800° C. and 850° C., respectively) is used to fabricate the GaN (epitaxy) layer 1. Then, the temperature of the substrate is reduced to 650° C. with a In/Ga flux ratio of 1.26 in order to grow the InGaN (buffer) layer for 30 minutes. Finally, the power of the RF-plasma is increased to 450 W to grow the InN for 60 minutes under the N/In flux ratio of 39.3 and the substrate temperature of 470° C. The growth time can be adjusted according to the requirement and is not limited thereto. The analysis and test results of the sample are described below.

Figure 2:
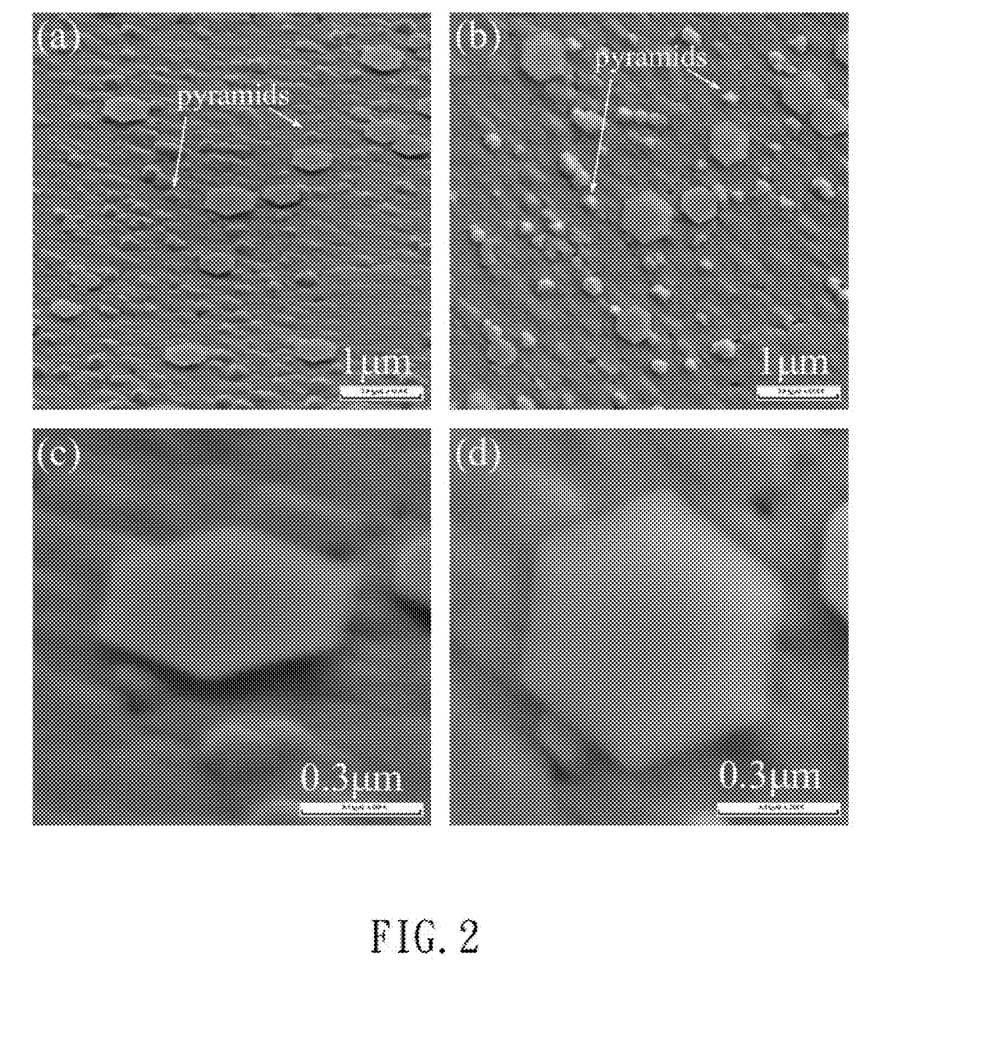
FIG. 2 shows different images of a sample of the III-nitride epitaxial structure obtained by field emission scanning electron microscopy.

To evaluate the surface morphology of the sample, the field emission scanning electron microscopy (FE-SEM, SII-3050) may be used. FIG. 2 includes four images (a), (b), (c) and (d). Images (a) and (b) are the SEM images with a tilted-angle view and a top view of the sample, respectively. The morphology of the sample exhibits that two-dimensional (2D) M-plane InN film and three-dimensional (3D) c-plane InN hexagonal thin disks can be grown on the LAO substrate.

Images (c) and (d) are the SEM images with a tilted-angle view and a top view of the InN thin disk shown in the center of image (b), and the diameter of the InN disk is 0.74 μm. The micrographic images of the sample shows that the 2D M-plane InN film are developed along with the lateral orientation $[11\bar{2}0]_{InN}//[001]_{LAO}$, while the 3D c-plane InN hexagonal thin disks and nanopillars are grown atop an anionic hexagonal basal plane of LAO. In this paper, the two-orientation growth is applied to the M-plane InN film and 3D c-plane InN hexagonal thin disks on LAO substrate with GaN and InGaN buffer layers. The crystal structure of the sample is characterized by the high-resolution X-ray diffraction (XRD) (Bede D1) measurements and is showed in FIG. 3. The indium content of M-plane $In_xGa_{1-x}N$ is evaluated by Vegard's equation, giving the 2θ peak of X-ray diffraction pattern $(31.69\pm0.01)°$ to $In_{0.20}Ga_{0.80}N$. The 2θ peaks at $(29.07\pm0.01)°$, $(31.31\pm0.01)°$, $(32.29\pm0.01)°$ and $(34.69\pm0.01)°$ correspond to the X-ray diffraction patterns from M-plane InN $(1\bar{1}00)$, c-plane InN $(000\bar{2})$, M-plane GaN $(1\bar{1}00)$ and LAO (100), respectively. These peak positions for the X-ray diffraction patterns can be obtained by software Quick Graph (Version 2.0) with the Asymmetric Double Sigmoidal linear curve fitting, and matched with those data of the standard wurtzite structure bulk InN (JCPDS file No. 50-1239). The results can be reconfirmed by software OriginPro 8.0 with a Gaussian-function curve fitting.

Figure 3:
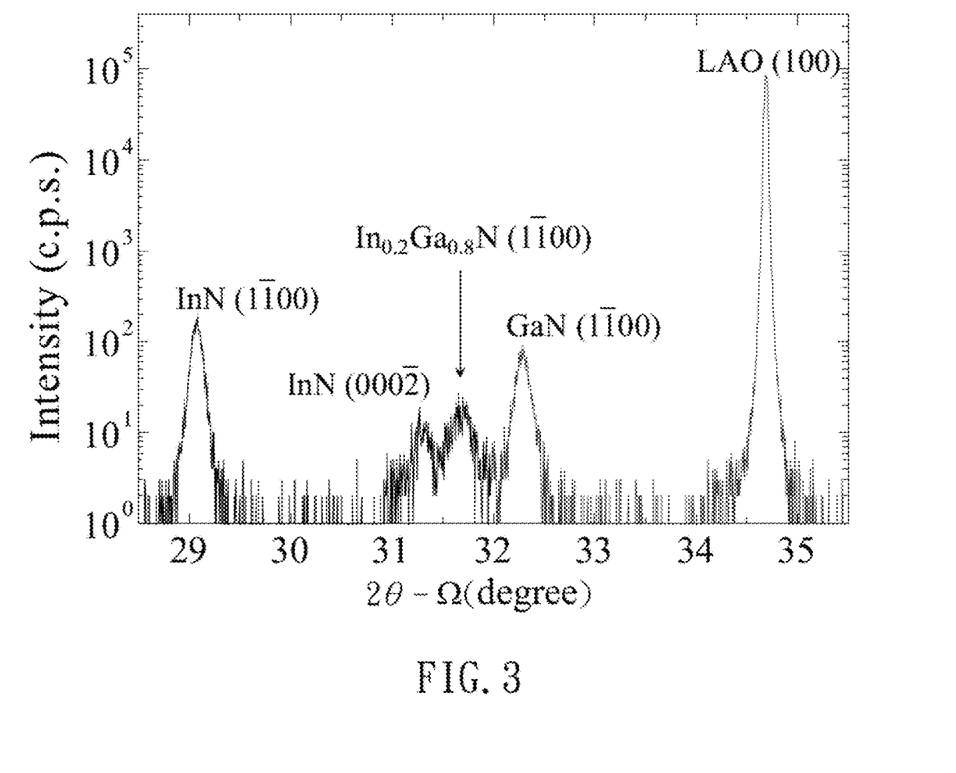
FIG. 3 shows an intensity diagram of the lattice structure of the sample as analyzed by high-resolution X-ray diffraction.

As compared to Bragg's law (2d sin θ=nλ) and Cu $K_{\alpha 1}$ □ wavelength λ=0.1540562 nm, the d-spacing between $\{000\bar{2}\}$ planes of InN is evaluated to be $d_{0002}$=0.28216 nm. Compared with the value on JCPDS file, $d_{0002}$=0.28528 nm, the difference between wurtzite InN microdisk and bulk InN is 1.09%, indicating that the lattice constant of InN microdisk is smaller than that of bulk InN.

The microstructure of the sample is analyzed by field emission transmission electron microscope (FE-TEM) (Phillips, model Tecnai F-20) with an electron voltage of 200 kV. The cross-sectional TEM specimen of the sample is prepared by a dual-beam FIB system (Seiko Inc., SII-3050), on the cleavage plane along $[1\bar{1}00]$ direction of the c-plane InN hexagonal thin disk. The FIB is performed with accelerated voltage of 30 kV to cut the samples roughly and then refined the specimen further by accelerated voltage of 5 kV.

Figure 4:
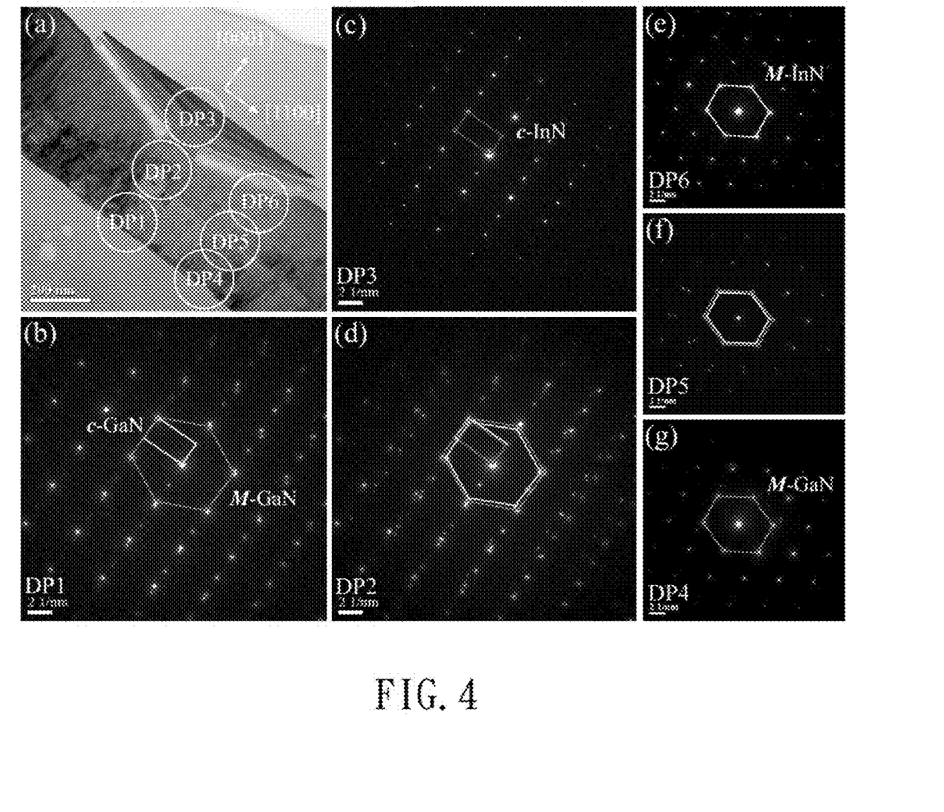
FIG. 4 shows a bright field image with $[11\bar{2}0]_{InN}//[001]_{LAO}$ zone axis and different selective area diffraction patterns.

FIG. 4 includes seven images (a), (b), (c), (d), (e), (f) and (g). Image (a) in FIG. 4 shows the bright field image with $[11\bar{2}0]_{InN}//[001]_{LAO}$ zone axis. It clearly exhibits that InN is well-formed on InGaN buffer layer and the InGaN buffer layer is well-established on GaN epi-layer as shown in the areas of DP4 to DP6. The thicknesses of M-plane InN, M-plane InGaN and M-plane GaN are measured to be about 265 nm, 51 nm and 137 nm, respectively. At the area of DP3, a c-plane InN hexagonal thin disk is established. The height for the c-plane InN hexagonal thin disk from neck to top is about 188 nm. The selective area diffraction (SAD) patterns in the areas located in DP1-DP6 are shown in images (b)-(g) in FIG. 4.

Image (b) in FIG. 4 clearly shows one rectangular (white) and one hexagonal (blue) diffraction patterns overlapped at the location of DP1, indicating that the c-plane wurtzite GaN and M-plane wurtzite GaN are initially nucleated atop the LAO substrate. It is found that the intensity of the hexagonal diffraction spots are brighter than the rectangular ones, indicating that the growth condition is suitable to 2D M-plane wurtzite GaN film at the beginning of nucleation. Image (c) in FIG. 4 simply shows a single rectangular diffraction pattern (red) at the location of DP3, indicating that the hexagonal thin disk is uniquely formed by the c-plane wurtzite InN. The d-spacing between $\{000\bar{1}\}$ planes of InN hexagonal thin disk is measured to be $d_c$=0.5687 nm, and the d-spacing between $\{1\bar{1}00\}$ planes of InN hexagonal thin disk is $d_M$=0.3025 nm. Compared with the values on JCPDS file No. 50-1239 which are 0.5703 nm and 0.30647 nm, respectively, the difference between wurtzite InN microdisk and bulk InN for $d_c$ and $d_M$ are 0.28% and 1.24%, respectively, revealing that the lattice constant of wurtzite InN microdisk is smaller than that of bulk InN. The result is consistent with the X-ray diffraction patterns.

At the neck area of the disk (location of DP2), the SAD patterns show the overlapping diagram of two rectangles and two hexagons in image (d) of FIG. 4, indicating that an M-plane InN (yellow hexagon) is formed in addition to the c-plane GaN (white rectangle), c-plane InN (red rectangle) and M-plane GaN (blue hexagon) at the neck area.

The M-plane InN (yellow hexagon) can be checked by the SAD patterns performed at the locations of DP4-DP6, as shown in images (e)-(g) of FIG. 4. At the location of DP6, only a single hexagonal pattern (yellow) is detected for the M-plane wurtzite InN, as shown in image (e) of FIG. 4. At the location of DP4, it shows one hexagonal (blue) diffraction pattern for M-plane GaN in image (g) of FIG. 4, with some unclear spots which are produced from the diffraction of LAO substrate. At the location of DP5, two hexagonal patterns are overlapped in image (f) of FIG. 4, indicating the formation of both M-plane GaN (blue hexagon) and InN (yellow hexagon) occurred. These two hexagons are identical to those shown in image (d) of FIG. 4, indicating that the M-plane wurtzite InN and M-plane wurtzite GaN are grown in the same crystalline direction. From the analyses of SAD patterns, it can be found that the c-plane wurtzite nanocrystal is embedded between M-plane wurtzite GaN areas at the beginning of nucleation when GaN is grown on LAO substrate (e.g., at the location of DP1). The detailed microstructure of the neck area is investigated by high-resolution transmission electron microscopy.

Figure 5:
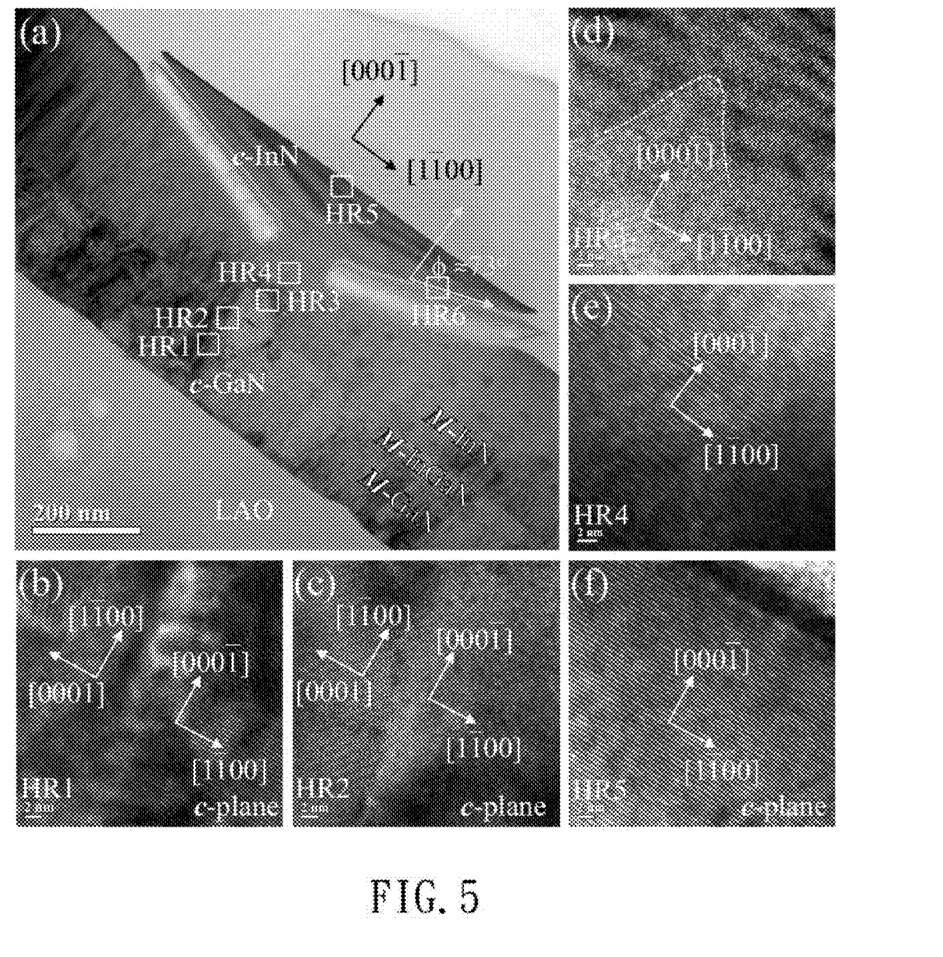
FIG. 5 shows different high-resolution TEM images of the sample at different areas.

FIG. 5 includes seven images (a), (b), (c), (d), (e) and (f). The high-resolution TEM images with the beam direction of $[11\bar{2}0]_{InN}//[001]_{LAO}$ are performed at the areas HR1-HR6 of the sample, as shown in image (a) of FIG. 5. The interfaces between c-plane and M-plane wurtzite GaN, InGaN, and InN are shown in images (b) and (c) of FIG. 5. The staking faults are found at the boundary between c-plane and M-plane GaN which releases the dislocations between the misfit c-plane and M-plane wurtzite structures of GaN and InGaN. The c-plane wurtzite structure is followed up to the neck area (e.g., HR3) and formed a uniform c-plane InGaN pyramid-shaped structure, as shown in image (d) of FIG. 5. Outside the pyramid-shaped structure, the wave-shaped structures are produced by the staking faults between the misfit c-plane wurtzite structures of InGaN and InN. The uniform c-plane InGaN pyramids can be observed in images (a) and (b) of FIG. 2, which emits a higher illumination intensity like a quantum-dot structure. The wave-shaped structures become uniform at the area HR4, as shown in image (e) of FIG. 5. The c-plane wurtzite structure is followed further to form the InN hexagonal microdisk structures. The symmetric hexagonal shape reveals the high-quality crystalline structure of the InN microdisk, as shown in image (f) of FIG. 5.

It is noted that the thinness of the hexagonal microdisk structure leads to an angle of 73° off the c-axis in image (a) of FIG. 5, which is much greater than the angle of GaN microdisk, obtained from the lateral over-growth along the $(1\bar{1}00)$ direction for each unit step-layer by one $d_M$-spacing, $\theta=\tan^{-1}(d_M/d_c)=28°$.

Figure 6:
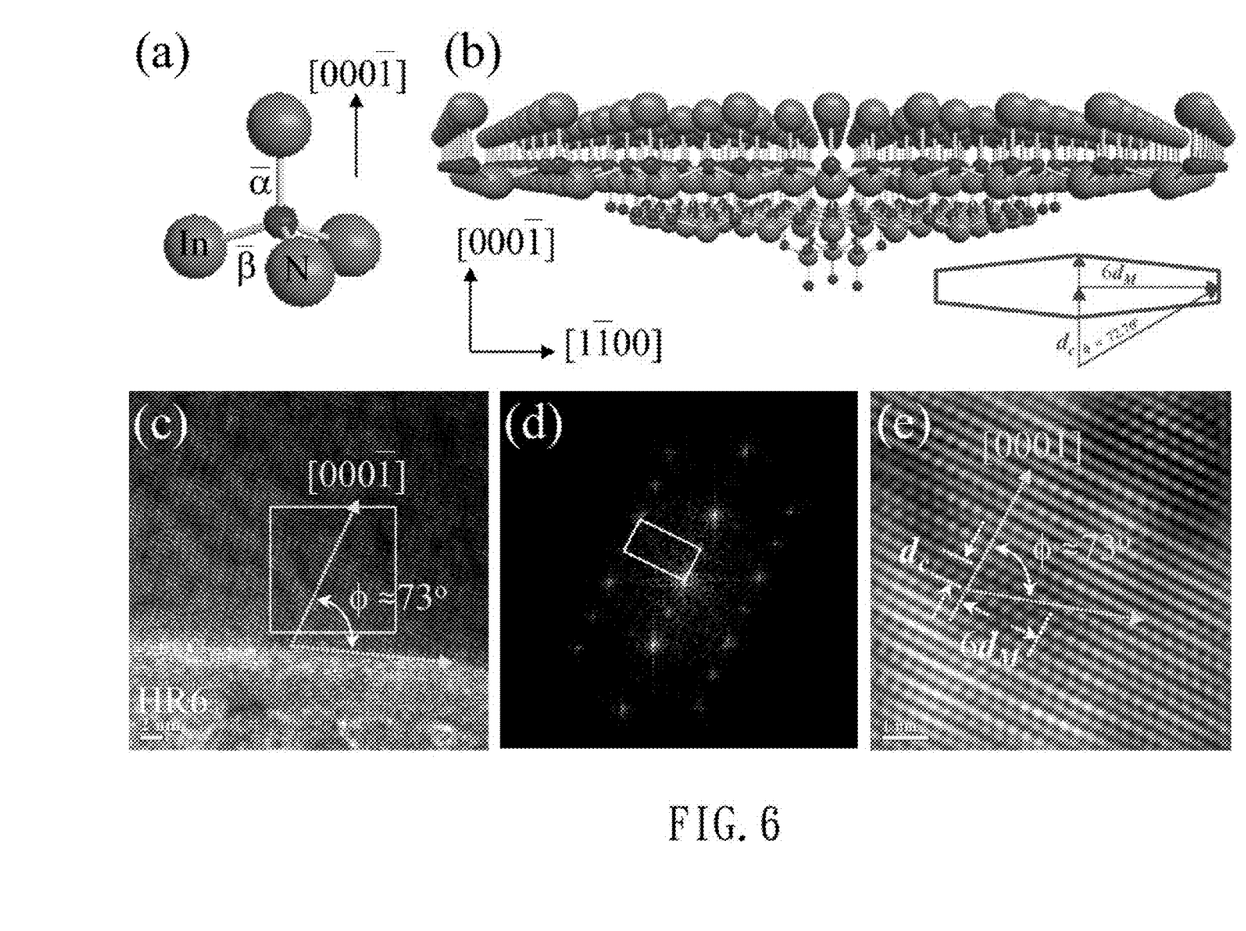
FIG. 6 shows different high-resolution TEM images of the sample based on the ball-stick model of standard wurtzite InN (JCPDS file No. 50-1239).

FIG. 6 includes five images (a), (b), (c), (d) and (e). To establish the growth mechanism of the thin InN hexagonal microdisk, a ball-stick model for the self-assembled thin InN microdisk is demonstrated. The ball-stick model for the standard wurtzite InN (JCPDS file No. 50-1239) with a=b=0.3537 nm, c=0.5703 nm, and u=$\bar{a}/c$=3/8 is used to simulate the c-plane InN hexagonal microdisk in image (a) of FIG. 6, where the blue balls represent indium atoms and red balls represent nitride atoms. The GaN (000$\bar{1}$) microdisk with a tilted angle of 28° is established with the capture of the nitride atoms by the $\bar{\beta}$-dangling bonds of the most-outside Ga atoms for each unit step-layer during the GaN lateral over-growth.

In the case of InN microdisk, when the growth temperature is lowered to 470° C., the c-plane InN (000$\bar{1}$) hexagonal thin disk is built up with the capture of the nitride atoms by the $\bar{\beta}$-dangling bonds of the most-outside indium atoms and then the lateral over-growth occurred; capture of the indium atoms by $\bar{\beta}$-dangling bonds of the nitride atoms, to form the thin microdisk. The lateral over-growth along the ($\bar{1}$100) direction is extended to six $d_M$-spacings for each unit step-layer (i.e. $d_c$-spacing), resulting in the angle of 73° off the c-axis.

Based on the ball-stick model, the laterally extensive width along the [1$\bar{1}$00]$_{InN}$ direction per unit step-layer is equal to 3$\sqrt{3}$a. The edge was then tilted off the c-axis [000$\bar{1}$] direction by the angle, $\phi$=tan$^{-1}$(3$\sqrt{3}$a/c)=72.76°, where 3$\sqrt{3}$a is equal to 6$d_M$, as shown in image (b) of FIG. 6. The angle from the measured SAD data at the InN hexagonal thin disk in image (c) of FIG. 4 is also calculated. It is obtained that the d-spacing between {000$\bar{1}$} planes is $d_c$=0.5687 nm and the d-spacing between {1$\bar{1}$00} planes is $d_M$=0.3025 nm, resulting in $\phi$=tan$^{-1}$(6$d_M$/$d_c$)=72.60°, which is in good agreement with the model predicted.

The angle between edge and growth direction can be examined directly by the high-resolution TEM image performed at HR6 to be about 72°-73°, as shown in image (c) of FIG. 6. In order to check the angle between edge and growth direction, the fast Fourier transform (FFT) and inversed fast Fourier transform (IFFT) can be made from the high-resolution TEM image at HR6. Images (d) and (e) of FIG. 5 show the FFT and IFFT patterns of the white-dot square area in image (c) of FIG. 5, which reconfirms that the oblique angle ($\phi$□≈73°) of c-plane InN hexagonal thin disk is formed by the lateral over-growth of wurtzite structure.

InN hexagonal thin wurtzite disks can be grown on γ-LiAlO$_2$ substrate by plasma-assisted molecular-beam epitaxy. From the surface morphology and microstructure analyses, it is found that c-plane wurtzite can be established at the nucleation of GaN on LAO substrate, and c-plane InN hexagonal thin disks can be built up at low temperature (470° C.) after the InGaN buffer layer. The c-plane InN (000$\bar{1}$) hexagonal thin disk is produced with the capture of the nitride atoms by the $\bar{\beta}$-dangling bonds of the most-outside indium atoms, and then laterally over-grown along [1$\bar{1}$00] direction by 6 $d_M$-spacings for a unit step-layer.

Based on this, in the embodiment of the disclosure, InN hexagonal thin wurtzite microdisks are grown on the LAO substrate by plasma-assisted molecular-beam epitaxy at low temperature (470° C.). When the $\bar{\beta}$-dangling bonds of the most-outside indium atoms capture the nitride atoms, the $\bar{\beta}$-dangling bonds of the N atoms also capture the indium atoms and the lateral growth occurs. From the analyses of high-resolution transmission electron microscopy, the lateral over-grown width is extended to three unit cells at c-axis direction for a unit step-layer, resulting in an oblique surface with 73° off c-axis. Therefore, the application can effectively grow the thin InN microdisks for growth of the In$_x$Ga$_{1-x}$N/GaN quantum wells, and it is not required to cut the thin InN microdisks. Accordingly, the thin InN microdisks can be used in the GaN-based while light LED, effectively reducing the lattice mismatch in the a-axis. The produced LEDs can have a higher light-emitting efficiency, a simplified production process and a reduced energy consumption and cost. This is advantageous in producing the light-emitting devices with a higher illumination quality for daily life, increasing the industrial value and achieving a win-win situation among the users, manufactures and governments.

Although the disclosure has been described in detail with reference to its presently preferable embodiments, it will be understood by one of ordinary skill in the art that various modifications can be made without departing from the spirit and the scope of the disclosure, as set forth in the appended claims.

What is claimed is:

1. An III-nitride epitaxial structure comprising:
    a gallium nitride layer comprising a M-plane gallium nitride and a c-plane gallium nitride, wherein the M-plane gallium nitride surrounds the c-plane gallium nitride;
    an indium gallium nitride layer arranged on the gallium nitride layer, wherein the indium gallium nitride layer comprises a M-plane indium gallium nitride and a c-plane indium gallium nitride, wherein the M-plane indium gallium nitride surrounds the c-plane indium gallium nitride; and
    an indium nitride layer arranged on the indium gallium nitride layer, wherein the indium nitride layer comprises a M-plane indium nitride and a c-plane indium nitride, wherein the M-plane indium nitride surrounds the c-plane indium nitride;
    wherein the c-plane gallium nitride, the c-plane indium gallium nitride, and the c-plane indium nitride are stacked each other to form a neck portion, wherein the neck portion is connected to a thin c-plane indium nitride disk, and the thin c-plane indium nitride disk is spaced from the M-plane indium nitride by a gap.

2. The III-nitride epitaxial structure as claimed in claim 1, wherein the thin c-plane indium nitride disk has a growth direction, wherein a side cross section of the thin c-plane indium nitride disk has an inclined edge facing the M-plane indium nitride, wherein an included angle between the inclined edge and the growth direction is between 72-73 degrees.

3. The III-nitride epitaxial structure as claimed in claim 1, wherein an interface between the c-plane indium gallium nitride and the c-plane indium nitride is in a non-planar form.

4. The III-nitride epitaxial structure as claimed in claim 1, wherein the thin c-plane indium nitride disk has a thickness of 200 nm.

5. A method for manufacturing an III-nitride epitaxial structure comprising:
    setting a temperature of a substrate as 800° C. in order for gallium atoms to be placed on the substrate for a first growth time;
    maintaining a plasma power as 300 W and a flux ratio of nitride to gallium as 39.9 to 55.9 under a growth temperature of 800° C. for a second growth time and then under the growth temperature of 850° C. for a third growth time;
    reducing the temperature of the substrate to 650° C. while maintaining a flux ratio of indium to gallium as 1.26 for a fourth growth time; and
    increasing the plasma power to 450 W and adjusting a flux ratio of nitride to indium as 39.3 while maintaining the temperature of the substrate as 470° C. for a fifth growth time.

6. The method for manufacturing the III-nitride epitaxial structure as claimed in claim 5, wherein the first growth time is 5 minutes.

7. The method for manufacturing the III-nitride epitaxial structure as claimed in claim 5, wherein the second growth time is 25 minutes.

8. The method for manufacturing the III-nitride epitaxial structure as claimed in claim 5, wherein the third growth time is 30 minutes.

9. The method for manufacturing the III-nitride epitaxial structure as claimed in claim 5, wherein the fourth growth time is 30 minutes.

10. The method for manufacturing the III-nitride epitaxial structure as claimed in claim 5, wherein the fifth growth time is 60 minutes.

\* \* \* \* \*